United States Patent [19]
Yero

[11] Patent Number: 5,923,590
[45] Date of Patent: Jul. 13, 1999

[54] DEVICE FOR READING CELLS OF A MEMORY

[75] Inventor: Emilio Yero, Aix en Provence, France

[73] Assignee: SGS-Thomson Microelectronics S.A., Saint Genis, France

[21] Appl. No.: 08/873,502

[22] Filed: Jun. 12, 1997

[30] Foreign Application Priority Data

Jun. 13, 1996 [FR] France ................................ 96 07374

[51] Int. Cl.$^6$ .................................................. G11C 13/00
[52] U.S. Cl. ...................... 365/189.01; 365/203; 365/210
[58] Field of Search ........................ 365/189.01, 230.01, 365/203, 210

[56] References Cited

U.S. PATENT DOCUMENTS

| 4,779,272 | 10/1988 | Kohda et al. ...................... 365/189.01 |
| 5,172,338 | 12/1992 | Mehrotra et al. ........................ 365/185 |
| 5,381,054 | 1/1995 | Standley ................................... 327/82 |

FOREIGN PATENT DOCUMENTS

| 0 322 063 | 6/1989 | European Pat. Off. ........ G11C 27/02 |
| 0 322 074 | 6/1989 | European Pat. Off. .......... G05F 3/26 |
| 0 397 355 | 11/1990 | European Pat. Off. .......... G11C 7/06 |

OTHER PUBLICATIONS

French Search Report from French application No. 9607374, filed Jun. 13, 1996.

A 1–Mbit CMOS EPROM with Enhanced Verification, Gastaldi et al., IEEE J of Solid–State Circuits, vol. 23, No. 5, Oct., 1988, pp. 1150–1155.

*Primary Examiner*—Terrell W. Fears
*Attorney, Agent, or Firm*—Wolf, Greenfield & Sacks, P.C.

[57] ABSTRACT

A device for the reading of cells for a memory includes a high-gain current comparison circuit, including a first arm for the reproduction, by current mirror, of the reference current conducted by a reference cell and a second arm for the reproduction, by current mirror, of the read current of a selected memory cell. A current mirror structure is provided to reproduce the current of the first arm in the second arm so as to obtain the comparison and produce a representative voltage level at output.

21 Claims, 4 Drawing Sheets

DEVICE FOR READING CELLS OF A MEMORY

BACKGROUND OF THE INVENTION

1. Field of the Invention

The present invention relates to a device for reading cells of a memory device, particularly a multi-level state cell memory device.

2. Discussion of the Related Art

Multi-level state cell memory devices are devices in which each multi-level state cell stores multiple information bits. To enable a multi-level state cell to store multiple information bits, each multi-level state cell must be capable of storing two logic (voltage) levels for each bit stored. For example, in order that each cell may store two information bits, it is necessary to have four possible charge levels on the floating gate. To read a multi-level state cell, it is necessary to have three references to discriminate between the four possible voltage levels and provide the corresponding binary information encoded in the two bits of the multi-level state cell. In addition, the reading device must include a "multi-level state" reading amplifier.

An example of a memory structure using multi-level state cells is given in the U.S. Pat. No. 5,438,546. In this structure, each of the multi-level state read amplifiers receives three voltage references to make the necessary comparisons and provide information encoded in two bits of the multi-level state cell. In this example, the read amplifier used is of the same type as those used for a normal memory cell having only one encoded bit.

However, for multi-level state cells, it should be possible to determine the voltage level actually memorized in the cell without any ambiguity. Thus, the voltage levels must be sufficiently separated for bit information to be read reliably, without possible confusion between any two voltage levels. It is therefore necessary to have a forbidden zone around each current reference wherein current should not be present. This forbidden zone is shown in FIG. 1 as $I_F$. FIG. 1 represents the distribution of read current for a multi-level state cell memory.

Each voltage level corresponds to a reference interval. In the figure, there are three reference currents: $I_{ref1}$, $I_{ref2}$, $I_{ref3}$ defining four permitted zones corresponding to the binary values 00, 01, 10 and 11. The forbidden zone around each current reference may be obtained in various ways. Consider the example of programming cells by hot electrons (the case of EPROM cells). An unprogrammed cell has a low threshold voltage (and therefore high read current). To program the cell, it is necessary to apply a first high-voltage programming pulse to the cell and then to perform a verification read operation and then a programming pulse is reapplied, etc., until an interval is found corresponding to the information to be programmed. To be certain that the cell will be programmed at the correct voltage level while not infringing the forbidden zone area, there is provision for the methodical subtraction from, or addition to the cell current, of a demarcation current $I_{margin}$, during the verification read operation. For example, to program the binary word 01, a check will be made to determine if Icell-Imargin $>I_{ref0}$. When the inequality is verified, the programming is terminated. In this way, it is certain that even if the programmed cell thereafter loses a little charge or even if, on the contrary, its charges increase slightly, an accurate reading will be done all the same.

To read the binary word memorized in a selected cell, the read current of this cell must be compared with each of the three current references. Then an encoding circuit delivers the corresponding binary word. A read of the cell can be performed by typical read comparators with current-voltage converters and voltage comparison. However, in this case, a different voltage reference is required for each comparator, requiring a total of three associated voltage reference circuits. Furthermore, these read comparators are fairly complicated to enable reliable and high-speed discrimination with respect to a given voltage reference. In addition, these read comparators consume a great deal of power and take up a large amount of space.

Therefore, what is needed is an approach that is more compact and consumes less power than current solutions. In particular, a solution which does not require voltage references circuits is desired.

SUMMARY OF THE INVENTION

One embodiment of the present invention includes a reading device based on the direct comparison of the read current of a selected cell with the reference currents, using a high-gain comparison circuit. Significantly, the invention produces a voltage difference of the order of the logic voltage is obtained at output for a small current difference in current between a reference current and the read current (10 microamperes for example). As described herein, the invention relates to a device for the reading of cells of a memory. According to the present invention, a device for reading cells of a memory device comprises a high-gain current comparison circuit, comprising a first arm for the reproducing, by current mirror, the reference current conducted by a reference cell and a second arm for reproducing, by current mirror, the read current of a selected memory cell. A current mirror structure is provided to reproduce the current of the first arm in the second arm to obtain the current difference and produce an output voltage level.

According to the present invention, a differential amplifier at the output of each current comparator (one comparator per reference current) can be simply used to discriminate between two voltage levels that are distant from each other (in practice, the difference between ground and a supply voltage) and thus provide a corresponding logic level 0 or 1. The present invention can be applied equally well to the usual memories with a single encoded information bit per cell. However, its structure is particularly advantageous for multi-level state cell memory devices. When the present invention is implemented in a multi-state cell, a current comparator using a current reference and an associated differential amplifier at output of each comparator could be implemented. These differential amplifiers then all use the same voltage reference of the order of half the value of the supply voltage.

In another embodiment of the present invention, the negative input of the differential amplifiers is positioned at the level of the reference voltage REF by means of a negative feedback loop activated in a precharging period to accelerate reading the memory cell. Conventional bit-line precharging circuits will advantageously be used.

In another embodiment of the present invention, a self-biasing structure will be used as a differential amplifier. Significantly, this self-biasing structure consumes less current than conventional differential amplifiers using a bias circuit and, at the same time, has high gain. A self-biased differential amplifier of this kind is described for example in the article by Mel Bazes, "Two Novel Fully Complementary Self-Biased Cmos Differential Amplifiers" in IEEE Journal of Solid State Circuits, Vol. 26, No. 2, February 1991.

An alternative embodiment of the invention includes a self-biased differential amplifier that enables a far more compact device for reading a memory cell.

BRIEF DESCRIPTION OF THE DRAWINGS

Other features and advantages of the invention are given in the following description, provided by way of an indication that in no way restricts the scope of the invention, with reference to the appended drawings, of which.

DETAILED DESCRIPTION

Figure 2A:
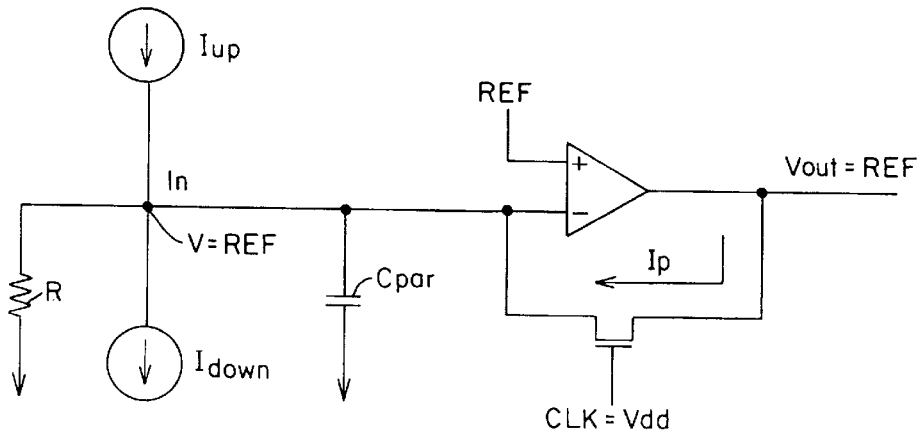
FIGS. 2a and 2b give a schematic view of a reading device according to the invention during the precharging and during the effective reading respectively.
Figure 2B:
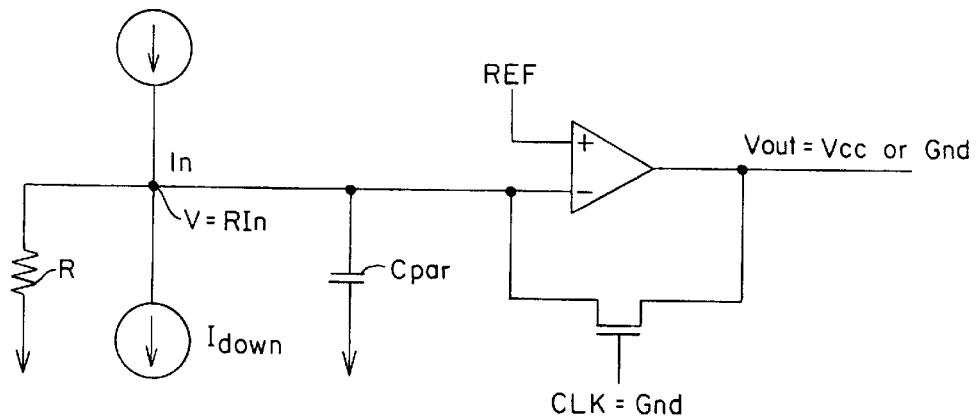

FIGS. 2a and 2b show the working of a read device according to the invention. A direct comparison is made between a reference current and the read current of a selected cell. This is performed by high-gain comparator with a dual current mirror structure. This comparator also includes a first arm for the reproduction, by a current mirror, of the reference current conducted by a reference cell. There is thus a current $I_{down}$ that flows in this first arm. A second arm, by current mirror, reproduces the read current $I_{cell}$ conducted by a selected cell in read mode. To obtain the comparison with the current $I_{down}$ the current $I_{down}$ is reproduced in the second arm by current mirror. Because of the dual current mirror structure (reference side and selected cell side), the current comparator has high impedance. Its equivalent resistance R may be in the range of 1 MW (FIG. 2b). The currents $I_{up}$ and $I_{down}$ preferably reproduce the reference and read currents with a factor K. A multiplication by K of this kind amplifies the currents $I_{up}$ and $I_{down}$ and therefore amplifies their difference. We then have a greater bias current of the comparator. Since the output of the comparator has a parasitic capacitor Cpar (FIGS. 2a and 2b), an increase in the bias current enables the circuit to be stabilized more quickly than conventional circuits. In practice, K is taken from a range of values of 1 to 5. Through this comparator, a difference of the order of 10 microamperes between $I_{up}$ and $I_{down}$ will give in theory a potential difference at output (at the terminals of the equivalent resistor) of the order of 10 volts. In practice, the output voltage V of the current comparator goes from 0 volts to Vdd, as a function of the value of the current in the cell that is being read.

The current comparator according to the invention is followed by a differential amplifier to convert the output of the current comparator into logic level 0 or 1. The positive input of the differential amplifier is connected to a reference voltage REF (of the order of Vdd/2). The negative input is connected to the output of the current comparator and therefore receives the output voltage V. The parasitic capacitance C, due in particular to the memory cells, is shown at this negative input. This parasitic capacitance slows down reading. Thus, in a known way as shown in FIG. 2a, there is provided a negative feedback loop to connect the output of the differential amplifier to its negative input. This makes it possible, in a precharging phase (high level of the clock pulse CLK) to impose the level of the reference voltage REF on this input of the amplifier: namely half of the possible excursion of the output of the current comparator (FIG. 2a). In the reading phase proper, shown schematically in FIG. 2b (low level of the clock pulse CLK), if the address decoding is stabilized, the output of the current comparator does not have to move in one direction and then in the other so that the differential amplifier can carry to out a reliable reading operation, and do so in a very short time. The negative feedback loop is conventionally controlled by a transistor activated at its gate by a clock signal CLK.

The fact of having a high-gain current comparator therefore enables the use of a simple differential amplifier that has to discriminate only between values that are distant from each other to give a logic 0 or logic 1 signal. This makes it possible to use an external reference REF of the order of Vdd/2 whatever may be the value of the reference current with which the cell current has been compared. In other words, the external reference REF does not depend on the value of the reference current.

Figure 3:
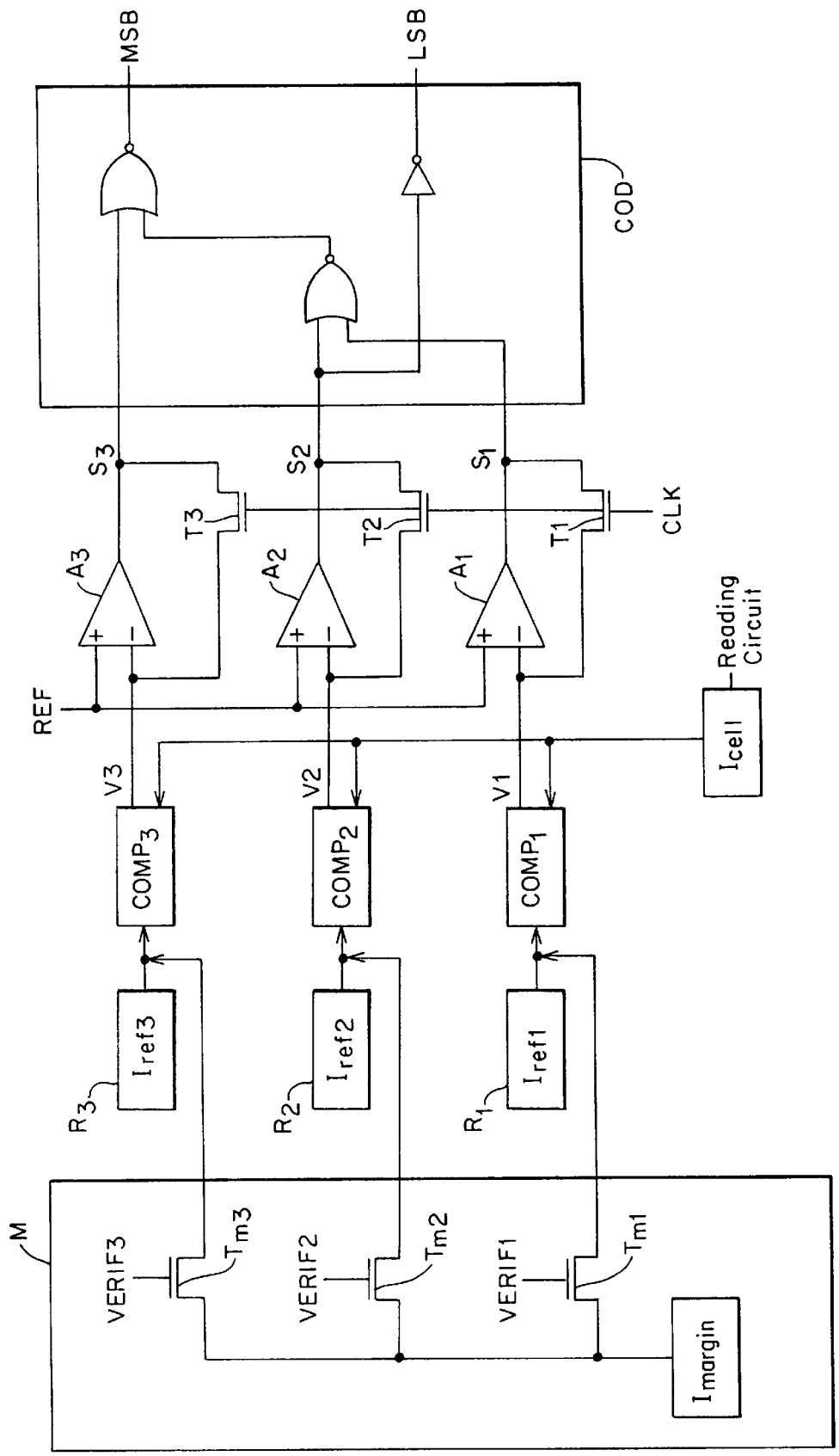
FIG. 3 shows a general block diagram of a reading device according to the invention for a memory of the type with four charge levels per cell.

A block diagram of a reading device according to the invention for a multi-level state floating-gate cell memory is shown in FIG. 3.

For each current reference $I_{ref1}$, $I_{ref2}$, $I_{ref3}$, there is a circuit respectively referenced $R_1$, $R_2$, $R_3$, to read this current and a comparison circuit respectively referenced $COMP_1$, $COMP_2$, $COMP_3$. These comparators first receive the current $I_{down}$ given by the read circuit of the associated reference cell and the current $I_{up}$ coming from a selected memory cell.

The output of each of the comparators, V1, V2, V3 respectively, is applied to the negative input of a differential amplifier, respectively $A_1$, $A_2$, $A_3$. These differential amplifiers each have their output $S_1$, $S_2$, $S_3$ connected, respectively, thus forming a loop to their negative input by means of a transistor T1, T2, T3. Transistors T1, T2, T3 are controlled by the clock signal CLK to be active during the precharging phase. An encoding circuit COD provides two corresponding MSB and LSB bits.

Figure 1:
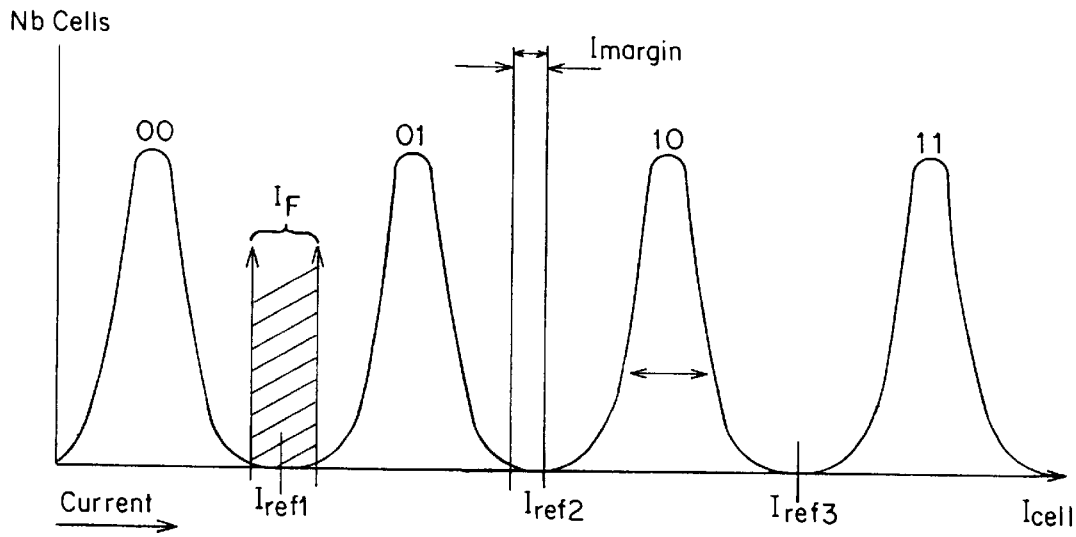
FIG. 1, shows the distribution of the cells with respect to the reference currents in a multi-level state memory.

FIG. 3 furthermore shows a circuit M, which makes it possible, in the verification read operation during the programming of the cell, to add a current $I_{margin}$ to the selected reference current (corresponding to the level to be programmed). This current $I_{margin}$ is added to the selected reference current by associated selection transistors $T_{m1}$, $T_{m2}$, $T_{m3}$. Thus, referring for example to FIG. 1, if programming the binary word 01 is desired, a programming pulse is applied and then it is determined whether the current of the cell is greater $I_{ref1}$ than the reference current $I_{ref1}$ plus the demarcation current $I_{margin}$. As soon as the cell current is greater than the reference current, the programming is ended.

Figure 4:
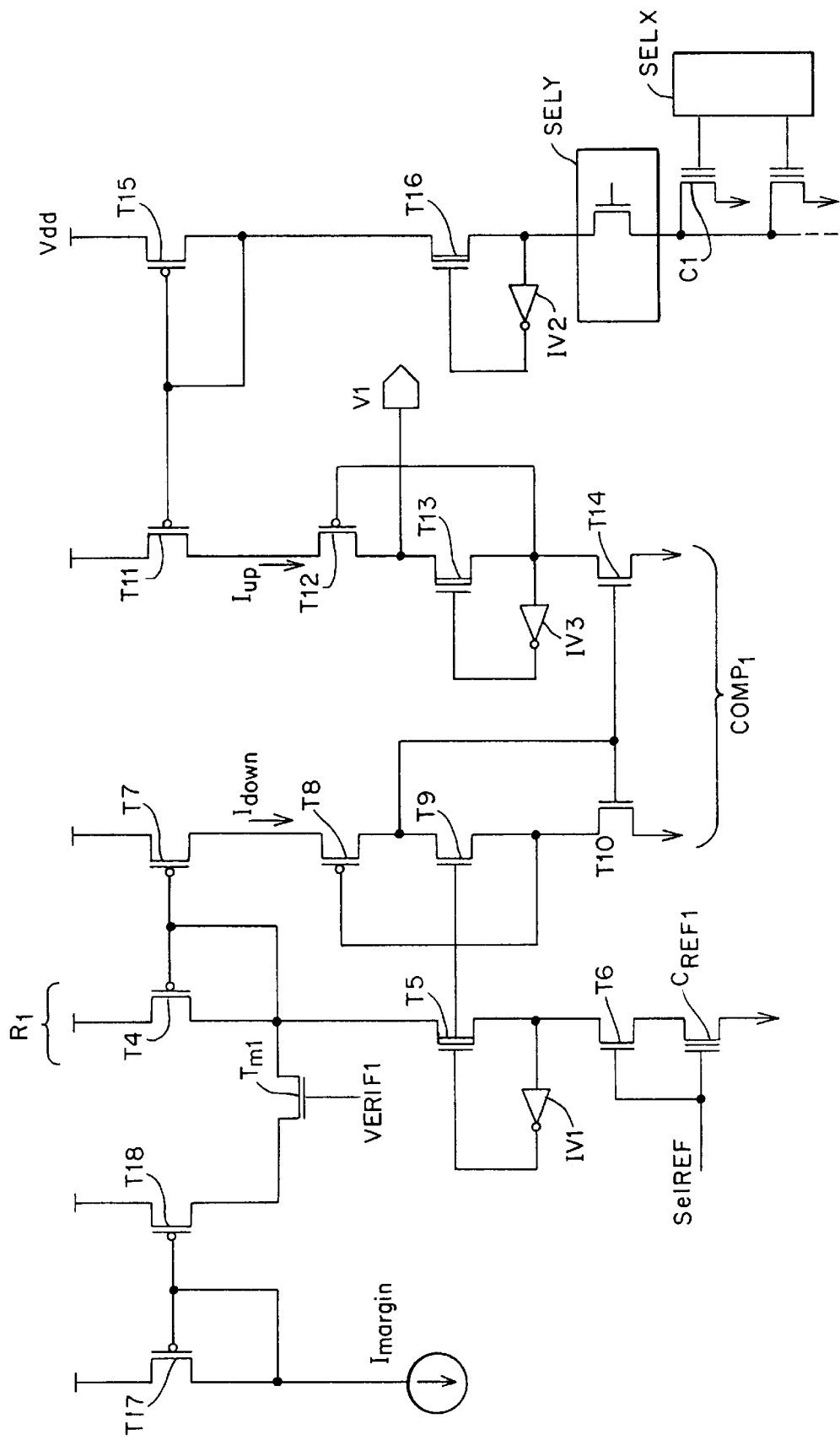
FIG. 4 shows a current comparator according to the invention.

FIG. 4 shows a detailed view of a current comparator $COMP_1$ according to the invention, with the read circuits of a reference cell $C_{ref1}$ and a selected memory cell $C_1$ and the circuit M for providing the demarcation current $I_{margin}$. In the example, the memory cells are floating-gate cells.

The reading circuit R1 associated with the reference memory cell $C_{ref1}$ comprises a first P type transistor T4 with its gate and drain connected together to form a current mirror with the comparison circuit. The source of the transistor T4 is connected to a logic supply voltage Vdd. The drain of the transistor T4 is connected to a current detection circuit that conventionally includes an N type transistor T5 whose source is connected to its gate by an inverter (gate-source negative feedback). The source of the transistor T5 is connected to the reference cell $C_{ref1}$ through a selection circuit (transistor T6 in the example).

A first arm of the comparator $COMP_1$ comprises a P type transistor T7, the source of which is connected to the logic supply voltage Vdd. This transistor T7 is mounted as a current mirror with the transistor T4. Thus, the current $I_{down}$ that flows into this arm is equal to K times the current $I_{ref}$. The factor K depends essentially on the geometrical ratio between the two transistors T4 and T7.

The first arm of the comparator $COMP_1$ comprises, in the invention, another P type transistor T8, the source of which is connected to the drain of the transistor T7 and the drain of which is connected to the drain of an N type transistor T9. The source of the transistor T9 is connected to the drain of another N type transistor T10. The source of the transistor T10 is connected to the ground.

The drain of the transistor T10 is connected to the gate of the transistor T8 and the source of the transistor T8 is connected to the gate of the transistor T10. The gate of the transistor T9 is connected to the gate of the transistor T5 of the reference current detection circuit.

The second arm of the comparator $COMP_1$ comprises a P type transistor T11, the source of which is connected to the logic supply voltage Vdd.

The drain of the transistor T11 is connected to the source of a P type transistor T12. The drain of the transistor T12 is connected to the drain of an N type transistor T13. The transistor T13 is mounted as a current detector with an inverter to connect its source to its gate forming a loop. The source of the transistor T13 is connected to the drain of an N type transistor T14, the source of which is connected to the ground. The gate of the transistor T14 of the second arm is connected to the gate of the transistor T10 of the first arm of the comparator.

The gate of the transistor T12 is connected to the source of the transistor T13.

The output of the comparator is given by the midpoint between the transistor T12 and the transistor T13. This output gives the voltage V1 that is applied to the input of the differential amplifier A, shown in FIG. 3.

The transistor T11 is mounted as a current mirror with respect to the read circuit associated with the selected cell $C_1$ (to be read). This read circuit comprises a P type transistor T15, the source of which is connected to the logic supply voltage Vdd, and the gate of which is connected to its drain. The gate of the transistor T11 is connected to the gate of this transistor T15. In this way, the current $I_{up}$ conducted by the transistor T11 is equal to K times the current conducted by the cell that is selected in read mode.

The transistor T15 has its drain connected to a transistor T16 mounted as a current detector with an inverter for the reverse looping of its source to its gate. The source of the transistor T16 is connected to the memory cell by the bit line selection circuit (SELY) schematically represented in the figure by a gate transistor. A word line selection circuit SELX selects a cell by applying a read voltage to its gate.

The working of a comparator according to another embodiment of the invention shall now be explained.

The transistors T4 and T7 enables the reproduction of the current Iref in the first arm of the comparator. Similarly, the transistors T11 and T15 enable the reproduction of the read current conducted by the selected memory cell in the second arm of the comparator. In the example, the currents are reproduced with a multiplier factor K. Finally, the transistors T10 and T11 enable the reproduction of the current $I_{down}$ of the first arm in the second arm, to make the comparison of the current $I_{down}$ with the current $I_{up}$ according to the principle already explained with reference to FIGS. 2a and 2b. Through the high impedance of the comparators due to the use of a dual current mirror structure to reproduce the reference current and the read current, this difference produces a great voltage difference depending on whether the currents are identical or not. This is what enables the use, at output, of a differential amplifier referenced Vdd/2.

To have an efficient reproduction of the reference current $I_{ref}$ in the first arm of the comparator, it is necessary to bias the transistors T4 and T7 as closely as possible. Both sources and gates of these transistors are already biased in the same way, by the current mirror assembly. However, the drains of these two transistors are independent. Indeed, since the transistor T4 is connected as a diode, the voltage of its drain is fixed by the current $I_{ref}$. However, the drain of the transistor T7 for its part is not controlled and may vary a great deal.

The same is the case with respect to the transistors T11 and T15, for the reproduction of the read current of the selected cell in the second arm of the comparator.

Thus, in one embodiment of the invention, there is provided a cascode assembly that enables the biasing of a controlled voltage at the drains of the transistors T7 and T11.

For the transistor T7, the cascode structure is given by the transistors T8 and T9. The transistor T8 is the cascode transistor and the transistor T9 gives the stable voltage needed for the gate of the transistor T8. This limits the low level of the drain of the transistor T7 to 1 volt plus a threshold voltage of a P type transistor (Vtp). Thus if, in practice, the voltage Vdd is equal to 3.3 volts and the threshold voltage Vtp is equal to 0.8 volts, the drain of the transistor T4 will be at 3.3–0.8=2.5 volts while the drain of the transistor T7 will be at the lowest at 1.8 volts and at the highest at 2.5 volts, giving a maximum difference of 700 millivolts.

The source voltage of the transistor T9 used as a reference for the transistor T8 is controlled by means of the transistor T5: they have the same gate voltage and therefore the same drain-source current. The standard assembly in negative feedback of the transistor T5 enables precisely the controlling of its source voltage at 1 volt which is the point at which the negative feedback inverter switches over.

With a cascode structure of this kind, the drain of the transistor T10 is no longer free to change (since it is connected to the source of the transistor T9, held at 1 volt). Now, the transistor T10 must reproduce the current $I_{down}$ in the second arm. For this purpose, it should, in a standard manner, be mounted as a diode by the connection of its gate to its drain.

Since the drain is not free to undergo change, because of the cascode structure, it has been necessary to find another connection point that is free to undergo change. This is why the gate of the transistor T10 is connected to the drain of the transistor T9 (or source of the transistor T8). Indeed, since the transistors T8 and T9 are saturated, this connection point remains relatively free to vary between 1 and 1.8 volts with typical parameters. With a reasonable size of T10, this zone is sufficient to provide for efficient reproduction of the current $I_{down}$. For the second arm of the comparator, there is a comparable structure. The transistor T13 which provides for the biasing, at 1 volt, of the gate of the cascode transistor T12 is, in the example, itself mounted in gate-source negative feedback mode.

Thus, the difference $I_{up}-I_{down}$ forces a changing of the voltage level VI on the drains of the transistors T12 and T13. In practice, this voltage level varies between 0 volts and Vdd, as seen with reference to FIGS. 2a and 2b.

The cascode voltage (T8, T9), (T12, T13) enables a substantial improvement of the reproduction of the currents, and therefore an improvement to the gain of the comparator according to the invention. However it is not necessary for the efficient working of the reading device. In particular, for low logic supply voltage applications (Vdd>2 volts) for which it is not possible to use the same number of transistors in series, only the transistors T7, T10, T11 and T14 will be used.

A circuit for the generation of the demarcation current $I_{margin}$ is also shown in FIG. 4. It comprises a current source which may be another reference cell with a quantity of charges trapped at its floating gate corresponding to the determined value of $I_{margin}$ or any other prior art current source. A current mirror assembly using transistors T17 and T18 of the same size enables the injection of the current $I_{margin}$ into the reference arm, upon the command VERIF1 applied to a gate transistor Tm1. The P type transistor T17 is mounted between Vdd and the current source Imargin and has its gate connected to its drain. The P type transistor T18 has its source connected to the logic supply voltage Vdd and its gate connected to the gate of the transistor T17. In verification read mode (VERIF1), for the programming of a selected cell, the transistor Tm1 connected between the drain of the transistor T18 and the drain of the transistor T4 enables the current Imargin to be added to the current $I_{ref}$ of the selected reference cell.

Figure 5:
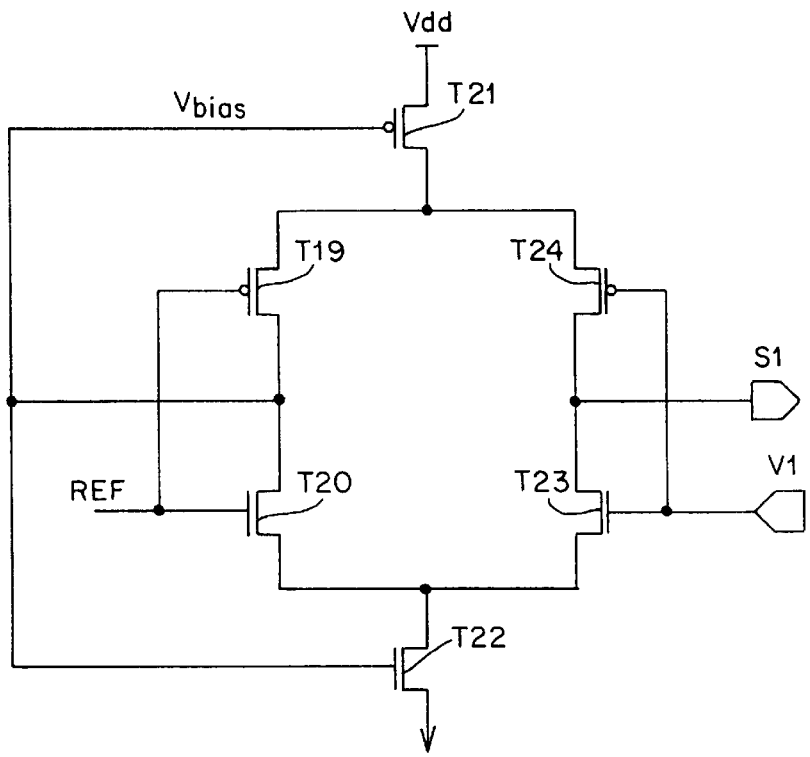
FIG. 5 shows a conventional self-biased differential amplifier.

As a differential amplifier, it is possible, for example, to use the structure shown in FIG. 5. It is a self-biased Cmos structure that provides high gain and is fast. A first Cmos inverter (T19 and T20) receives the reference voltage REF at input. The output point of this inverter gives the bias voltage $V_{bias}$ to the bias transistors T21 and T22 of the amplifier. The P type transistor T21 is connected between the voltage Vdd and the P type transistor of the inverter. The N type transistor T22 is connected between the transistor N of the inverter and the ground. A second Cmos inverter (T23 and T24), parallel-connected to the first one, receives the voltage to be compared, for example V1, at input. Its output S is the output of the differential amplifier.

Figure 6:
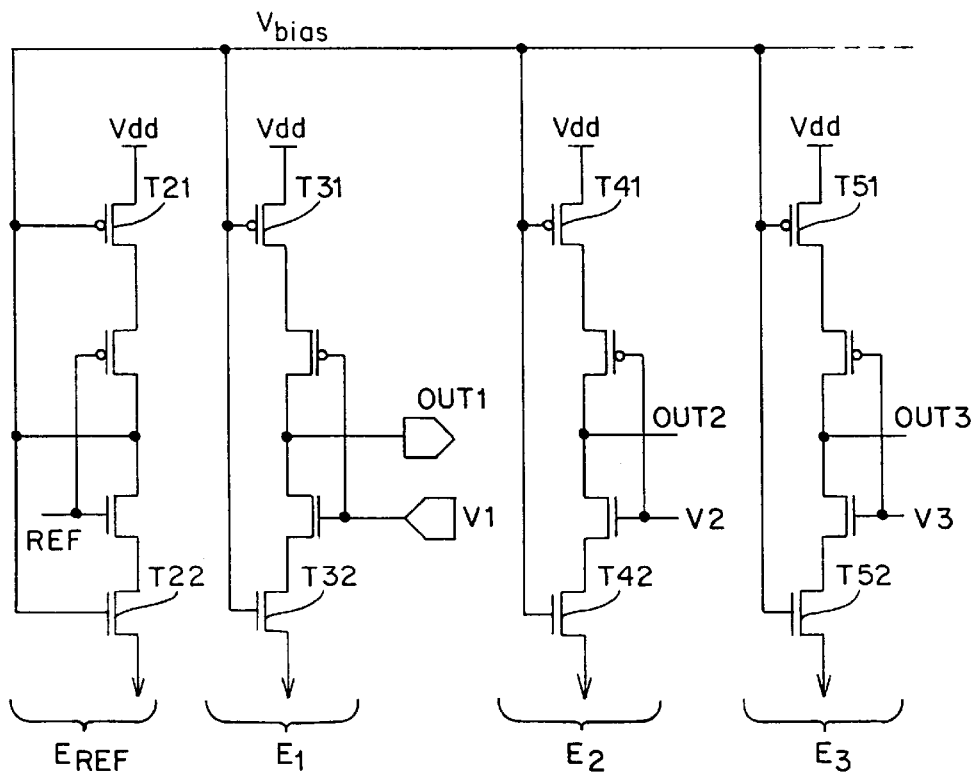
FIG. 6 shows a self-biased amplifier according to the invention.

In one embodiment of the invention, the reference part is separated from the voltage part to be compared. This results in the structure shown in FIG. 6 with a stage $E_{REF}$ exclusively for the reference and a stage exclusively for the input voltage to be compared, which gives the output. This separation makes it possible, in the event of the multi-level state memory, to have a reference stage common to all the comparators. Apart from the simplification of the structure and the valuable reduction in the number of transistors, a separation such as this of the reference stage $E_{REF}$ from the stages $E_1$, $E_2$, $E_3$ receiving the signal to be compared reduces the coupling between the reference signal REF and the input signals $V_1$, $V_2$, $V_3$. Thus, even if all the input signals move (non-stabilized address signals), the reference signal is not affected. This is a particularly valuable feature. It is necessary not to lose sight of the fact that, in practice, it is eight or sixteen cells that are read simultaneously in the memory. The structure of the invention then enables a substantial reduction of consumption. Indeed, in the case of eight cells read simultaneously, there are usually 2×8 arms that consume current. With the invention, there are only 1+8 arms that consume current.

For each inverter, there are then provided two associated bias transistors, biased as here above with the voltage $V_{bias}$ given by the reference stage. Thus, in FIG. 6, there are the biased transistors T21 and T22 for the reference stage, the transistors T31 and T32 for the stage receiving the input signal V1, the transistors T41 and T42 for the stage receiving the input signal V2 and the transistors T51 and T52 for the stage receiving the input signals V3. This structure is very useful in the context of the multi-state level memory. Indeed, instead of three full amplifiers A1, A2 and A3, it has been seen that this structure makes it possible to have only one reference stage and three stages $E_1$, $E_2$ and $E_3$ for the voltages to be compared.

Since the memories are generally organized in memory words, several cells are selected at the same time to give several pieces of information. There will thus be a read device according to the invention associated with each piece of data to be delivered. In the example of the multi-level state memory, each piece of information itself comprises several information bits.

The invention has been described in the context of a multi-level state memory for which it is particularly advantageous. However, the invention is not limited to this application alone. Nor is it limited to the number of current references taken as examples in the description. It can be applied to any type of memory.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A device for reading cells of a memory device, the device comprising a high-gain current comparison circuit, further including:
   a first branch for reproducing the reference current conducted by a reference cell by current mirror;
   a second branch for reproducing the read current of a selected memory cell by current mirror; and
   a current mirror for obtaining a comparison between said reference current and said read current and for producing an output voltage level based on said comparison.

2. The device according to claim 1, wherein a cascode assembly is provided in each branch for improving reproduction of said reference current and said read current.

3. The device according to claim 2, wherein a biasing reference for each cascode assembly is obtained by a transistor mounted in gate-source feedback mode.

4. The device according to claim 3, further comprising a differential amplifier receiving, at its negative input, the output of the high-gain current comparison circuit and, at its positive input, an external reference voltage.

5. The device according to claim 4, wherein said differential amplifier comprises a negative feedback loop to bring the negative input to the level of the external referenced voltage during a precharging phase.

6. The device according to claim 5, wherein said differential amplifier is self-biased.

7. The device according to claim 1, further comprising a differential amplifier receiving, at its negative input, the output of the high-gain current comparison circuit and, at its positive input, an external reference voltage.

8. The device according to claim 7, wherein said differential amplifier comprises a negative feedback loop to bring the negative input to the level of the external referenced voltage during a precharging phase.

9. The device according to claim 8, wherein said differential amplifier is self-biased.

10. A memory device comprising:
   a plurality of cells; and
   a reading device for reading said plurality of cells further comprising:
      a high-gain current comparison circuit, further including:
         a first branch for reproducing the reference current conducted by a reference cell by current mirror;
         a second branch for reproducing the read current of a selected memory cell by current mirror; and
         a current mirror for obtaining a comparison between said reference current and said read current and for producing an output voltage level based on said comparison.

11. The device according to claim 10, wherein a cascode assembly is provided in each branch for improving reproduction of said reference current and said read current.

12. The device according to claim 11, wherein a biasing reference for each cascode assembly is obtained by a transistor mounted in gate-source feedback mode.

13. The device according to claim 12, further comprising a differential amplifier receiving, at its negative input, the output of the high-gain current comparison circuit and, at its positive input, an external reference voltage.

14. The device according to claim 13, wherein said differential amplifier comprises a negative feedback loop to bring the negative input to the level of the external referenced voltage during a precharging phase.

15. The device according to claim 14, wherein said differential amplifier is self-biased.

16. The memory device of claim 13, wherein the differential amplifiers comprise a respective stage corresponding to the negative input to receive a voltage level to be compared and sharing, in common, a reference stage corresponding to the positive input and receiving the reference voltage.

17. The memory device of claim 10, comprising a circuit to give a demarcation current in the reading device associated with a selected reference cell in verification mode after programming.

18. A method for reading a cell of a memory device, the method comprising the following steps:
   reproducing a reference current conducted by a reference cell;
   reproducing a read current of a selected memory cell;
   comparing said reference current and said read current; and
   producing an output voltage level based on the a result of said comparing step.

19. The method of claim 18, further including the following step:
   differentially amplifying said output voltage to produce an output logic voltage.

20. A system for reading a cell of a memory device, the system comprising:
   means for reproducing a reference current conducted by a reference cell;
   means for reproducing a read current of a selected memory cell;
   means for comparing said reference current and said read current; and
   means producing an output voltage level based on the a result of said comparing means.

21. The system of claim 20, further comprising:
   means for differentially amplifying said output voltage to produce an output logic voltage.

* * * * *

UNITED STATES PATENT AND TRADEMARK OFFICE
CERTIFICATE OF CORRECTION

PATENT NO. : 5,923,590
DATED : July 13, 1999
INVENTOR(S): Emilio Yero

It is certified that error appears in the above-identified patent and that said Letters Patent is hereby corrected as shown below:

Col. 2, line 24 should read:
    voltage that is obtained at output for a small difference in Col. 7, line 43 should read:
    voltage Vdd and the P type transistor T15 of the inverter. The N Col. 7, line 44 should read:
    type transistor T22 is connected between the N-type transistor T20 of Signed and Sealed this Thirtieth Day of November, 1999

Attest:

Q. TODD DICKINSON

*Attesting Officer*      Acting Commissioner of Patents and Trademarks